United States Patent [19]

Shibata et al.

[11] Patent Number: 5,468,576
[45] Date of Patent: Nov. 21, 1995

[54] METHOD FOR MANUFACTURING EXPOSURE MASK

[75] Inventors: Tsuyoshi Shibata; Koji Hashimoto; Katsuhiko Hieda, all of Kanagawa, Japan

[73] Assignee: Kabushiki Kaisha Toshiba, Kawasaki, Japan

[21] Appl. No.: 853,436

[22] Filed: Mar. 18, 1992

[30]  Foreign Application Priority Data

Mar. 29, 1991  [JP]  Japan .................................. 3-067268

[51] Int. Cl.$^6$ ..................................................... G03F 9/00
[52] U.S. Cl. ................. 430/5; 430/324; 430/326
[58] Field of Search ............................... 430/5, 324, 326

[56]  References Cited

U.S. PATENT DOCUMENTS

| 4,468,420 | 8/1984 | Kawahara et al. | 427/93 |
| 5,178,975 | 1/1993 | Chiong et al. | 430/5 |
| 5,260,162 | 11/1993 | Khanna et al. | 430/190 |

FOREIGN PATENT DOCUMENTS

| 1190082 | 9/1985 | Canada | 430/5 |
| 0383534 | 8/1990 | European Pat. Off. | 430/5 |
| 57-196744 | 12/1982 | Japan . | |
| 58-173744 | 10/1983 | Japan . | |
| 62-181458 | 5/1989 | Japan . | |
| 2211451 | 8/1990 | Japan . | |
| 4153652 | 5/1992 | Japan | 430/5 |

*Primary Examiner*—James J. Seidleck
*Assistant Examiner*—R. F. Johnson
*Attorney, Agent, or Firm*—Oblon, Spivak, McClelland, Maier & Neustadt

[57]  ABSTRACT

A method for manufacturing an exposure mask provided with a substrate for transmitting an exposure light and with phase shifters arranged at prescribed intervals on the substrate for shifting the phase of the exposure light transmitted through the substrate by a half wavelength as compared with the phase of the exposure light transmitted through both the substrate and an opening between the phase shifters consists of the steps of preparing a solution containing a phase shifter material, arranging resist layers at the prescribed intervals on the substrate, immersing the substrate with the resist layers in the solution, forming the phase shifters on the substrate between the resist layers by a prescribed thickness by depositing the material of the phase shifter from the solution, and removing the resist layers from the substrate to form the openings.

1 Claim, 11 Drawing Sheets

FIG.3A
LEVENSON TYPE OF EXPOSURE MASK
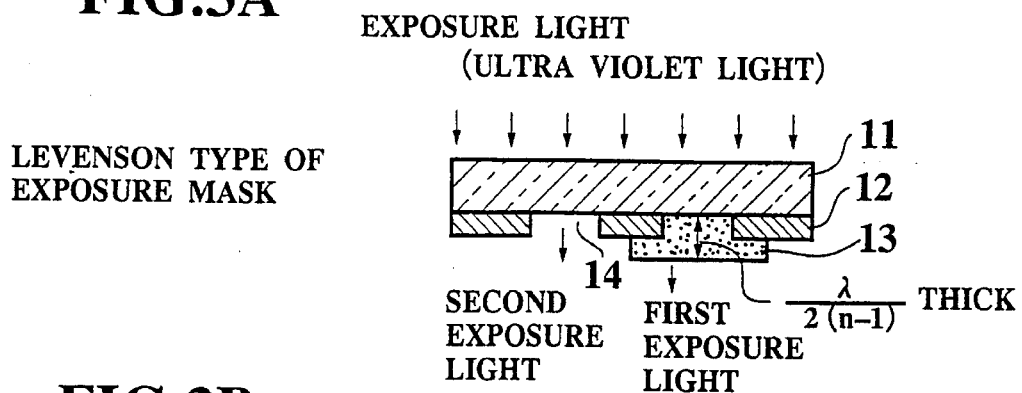
FIG.3B
AMPLITUDE DISTRIBUTION OF EXPOSURE LIGHT TRANSMITTED THROUGH EXPOSURE MASK IN CASES WHERE DIFFRACTION IS NOT CONSIDERED
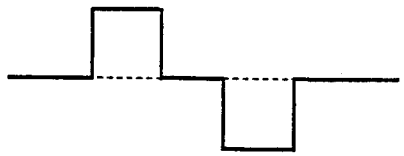
FIG.3C
AMPLITUDE DISTRIBUTION OF DIFFRECTED EXPOSURE LIGHT TRANSMITTED THROUGH EXPOSURE MASK
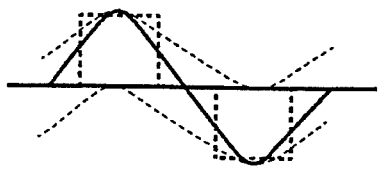
FIG.3D
INTENSITY DISTRIBUTION OF EXPOSURE LIGHT OPTICALLY DIFFRACTED AND INTERFERED
FIG.3E
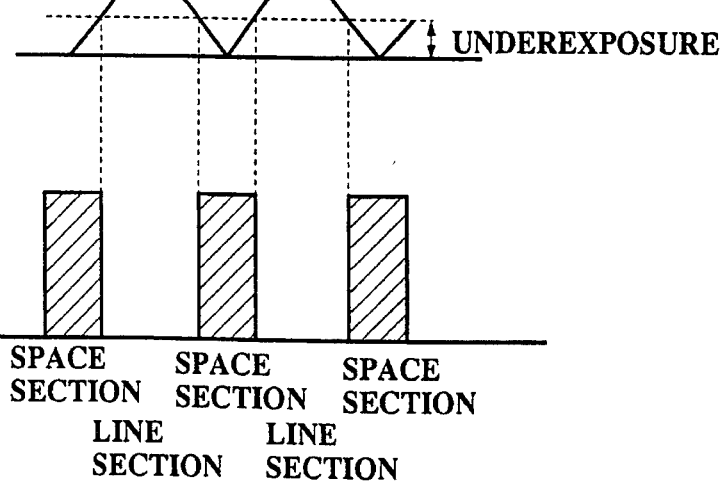

FIG.4A

SELF-ALIGNED TYPE OF EXPOSURE MASK

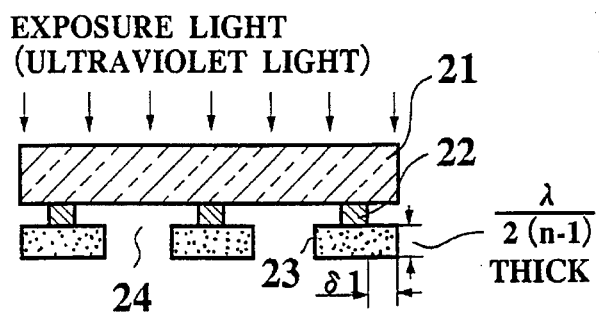

$\delta 1$ : OVERHANGED WIDTH

FIG.4B

AMPLITUDE DISTRIBUTION OF EXPOSURE LIGHT TRANSMITTED THROUGH EXPOSURE MASK IN CASES WHERE DIFFRACTION IS NOT CONSIDERED

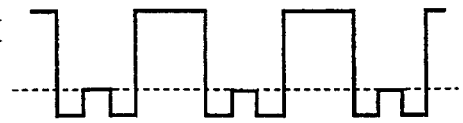

FIG.4C

AMPLITUDE DISTRIBUTION OF DIFFRACTED EXPOSURE LIGHT TRANSMITTED THROUGH EXPOSURE MASK

FIG.4D

INTENSITY DISTRIBUTION OF EXPOSURE LIGHT OPTICALLY DIFFRACTED AND INTERFERED

FIG.4E

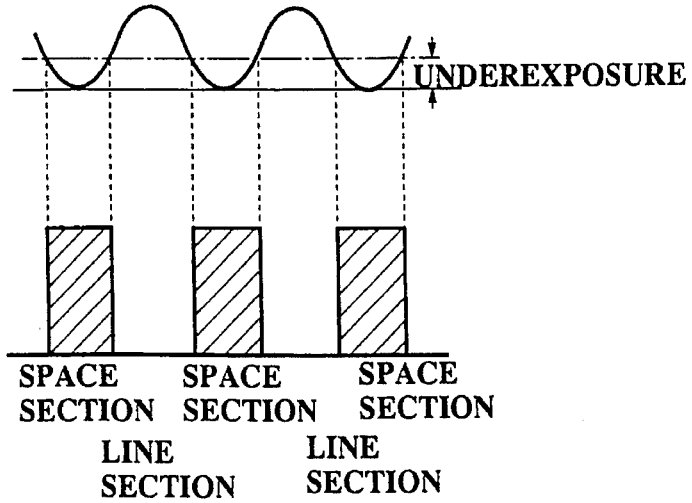

FIG.5A
SHIFT EDGE TYPE OF EXPOSURE MASK
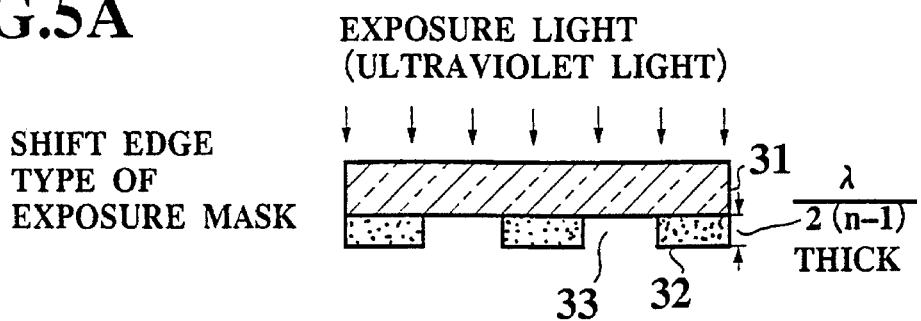
FIG.5B
AMPLITUDE DISTRIBUTION OF EXPOSURE LIGHT TRANSMITTED THROUGH EXPOSURE MASK IN CASES WHERE DIFFRACTION IS NOT CONSIDERED
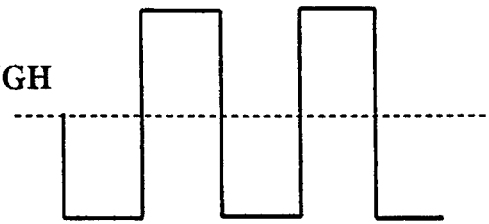
FIG.5C
AMPLITUDE DISTRIBUTION OF DIFFRACTED EXPOSURE LIGHT TRANSMITTED THROUGH EXPOSURE MASK
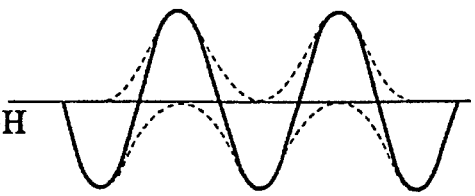
FIG.5D
INTENSITY DISTRIBUTION OF EXPOSURE LIGHT OPTICALLY DIFFRACTED AND INTERFERED
FIG.5E
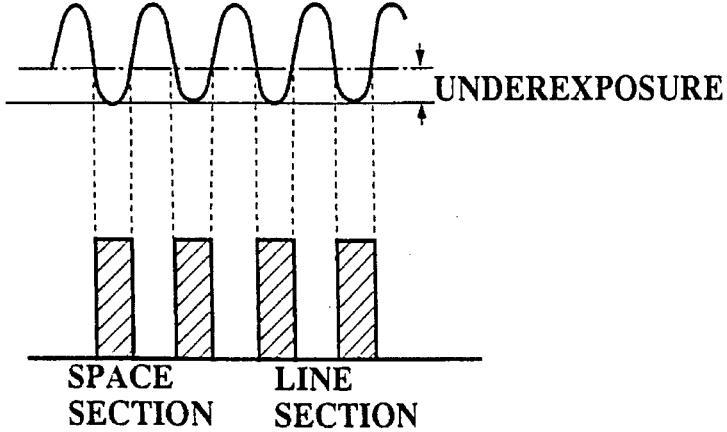

METHOD FOR MANUFACTURING EXPOSURE MASK

BACKGROUND OF THE INVENTION

1. Field of the Invention

The present invention relates to a method for manufacturing an exposure mask which is utilized in the manufacture of semiconductor integrated circuits and the like, and, in particular to a method for manufacturing an exposure mask which is provided with a phase-shifting mask by which the phase of the light is shifted.

2. Description of Background

In recent years, semiconductor circuits have become integrated on a large scale, so that a lithography technique is important in the manufacture of large-scale semiconductor integrated circuits.

Nowadays, light sources such as g-rays, i-rays, exicimer lasers, and X-rays have been adopted in manufacturing large-scale semiconductor integrated circuits by utilizing the lithography technique. Also, new resist materials which are chemically changed by exposed light generated by the light source have been developed to utilize the light source. Moreover, resist processing techniques such as a multi-layer resist method, a contrast enhanced lithography (CEL) method, and an image reverse method have been developed.

On the other hand, when the large-scale semiconductor integrated circuits are manufactured, an exposure mask is required to shield certain fields specified in the resist. That is, a striped pattern which is formed by alternately arranging dark and bright light regions is made by the light transmitted through the exposure mask. In detail, the specific fields in the resist aligned with the dark light region are not exposed by the light transmitted through the exposure mask so that the specific fields in the resist are selectively removed or remain after a prescribed removal process is implemented.

Therefore, the light intensity of the boundary between the bright and dark light regions must be considerably lowered to clarify the boundary, so that the resolution of the transmitted light can be improved.

Recently, a conventional method for manufacturing a exposure mask with a phase-shifting mask by utilizing a phase-shifting method has been proposed to improve the resolution of the transmitted light (lectured papers 8, page 497, lecture No. 4a-K-7 in the Applied Physics Society of Japan, autumn, 1988).

The phase-shifting method is described with reference to FIGS. 1A to 1F and 2 as follows.

FIGS. 1A, 1C, and 1E are cross sectional views showing a conventional method for manufacturing a conventional exposure mask which is utilized to make line sections and space sections on an exposed semiconductor device.

FIGS. 1B, 1D, and 1F are cross sectional views showing another conventional method for manufacturing another conventional exposure mask which is utilized to make an isolated space section on an exposed semiconductor device.

As shown in FIGS. 1A, 1B, a shading layer 1 made of chromium (Cr) or chromium oxide ($Cr_2O_3$) is deposited to a thickness of about 1000 angstroms (Å) on a quartz substrate 2 by a sputtering method. The exposure light cannot pass through the shading layer 1, but can pass through the quartz substrate 2 without a substantial decrease in intensity.

Thereafter, a resist layer 3 for protecting the shading layer 1 from being etched is coated and patterned on the shading layer 1 by an electron beam unit. Thereafter, as shown in FIGS. 1C, 1D, the shading layer 1 not covered by the resist layer 3 is etched by a wet etching method or a reactive ion etching method, and the shading layer 1 covered by the resist layer 3 is protected from the etching process. Therefore, the shading layer i not etched by the etching method is patterned to form a patterned shading layer 4 before the patterned resist layers 3 are removed. Openings 5 between the patterned shading layers 4 are wider than a pair of auxiliary openings 6 between the patterned shading layers 4.

Thereafter, as shown in FIG. 1E, the openings 5 are alternately deposited by a plurality of phase shifters 7 using a chemical vapour depositing (CVD) method. Moreover, as shown in FIG. 1F, each auxiliary opening 6 is covered by a phase shifter 8 by the CVD method, while the opening 5 is not covered by a phase shifter. The height of the phase shifters 7, 8 is a prescribed value $H=\lambda/2(n-1)$. Here, the symbol $\lambda$ indicates a wavelength of an exposure light transmitted from the quartz substrate 2 to the phase shifter 7 (8) or the opening 5, and the symbol n indicates the refractive index of the phase shifters 7, 8. Therefore, the phase of the exposure light transmitted through the quartz substrate 2 and the phase shifter 7, or 8 is shifted by a half wavelength $\lambda/2$ as compared with the exposure light transmitted the opening 5 through the quartz substrate 2.

FIGS. 2A, 2B are cross sectional views of the conventional exposure masks manufactured by the method shown in FIGS. 1A to 1F. FIGS. 2C, 2D show the amplitude of the exposure light transmitted from the quartz substrate 2 to the phase shifter 7 (8) or the opening 5.

As shown in FIGS. 2A, 2B, the phase of the exposure light transmitted through the phase shifter 7 (8) is shifted by a half wavelength as compared with the exposure light transmitted through the opening 5. Moreover, the exposure light transmitted through the phase shifter 7 (8) or the opening 5 is optically diffracted by the patterned shading layers 4, so that the various exposure lights transmitted through the exposure mask optically interfere with one another.

Therefore, as shown in FIG. 2C. 2D, the diffracted lights of which the amplitudes are shown by broken lines are superimposed on one another so that an interfered light of which the amplitude is shown by a solid line is formed. That is, the intensity of the exposure light is considerably decreased in optical paths specified between the phase-shifted light transmitted through the phase shifter 7 (8) and the exposure light transmitted through the opening 5.

Accordingly, because the light intensity is considerably decreased in the specific optical paths, the difference between dark and bright light regions alternately arranged by the light transmitted through the exposure mask can be clearly distinguished.

For example, in the case of the conventional exposure mask which is utilized to make line sections and space sections on a negative type of resist layer of an exposed semiconductor device, as shown in FIGS. 2A, 2C, the line sections are made in positions aligned with the opening 5 or the phase shifter 7 by exposure to the bright light transmitted through the exposure mask. Moreover, the space sections are made in positions aligned with the shading layer 1 by exposure to the dark light transmitted through the exposure mask.

On the other hand, in the case of a conventional exposure mask which is utilized to make an isolated space section on a positive type of resist layer of an exposed semiconductor device, as shown in FIGS. 2B, 2D, the intensity of the exposure light transmitted through the phase shifter 8 is, as is well known, considerably smaller than that of the exposure light transmitted through the opening 5 because the width of the auxiliary opening 6 is narrower than the width of the opening 5. Therefore, the shifted exposure light transmitted through the phase shifter 8 is considerably decreased after the shifted light is subjected to optical interference from the exposure light transmitted through the opening 5. As a result, the resist layer on the exposed semiconductor device is not exposed by the shifted exposure light because of insufficient light. That is, an isolated space section is made on the resist layer aligned with the opening 5 by exposing the bright light transmitted through the exposure mask, while the resist layer aligned with the phase shifters 8 is not exposed.

However, many drawbacks are generated in the above the exposure mask and the above method for manufacturing the exposure mask.

A first drawback of the method is as follows.

The phase shifters 7 must be alternately arranged in the openings 5 between the patterned shading layers 4 in cases where the line sections and the space sections are formed on the semiconductor device. Therefore, a manufacturing method includes at least a first pattern forming step for forming the patterned shading layers 4, a second pattern forming step for alternately forming the phase shifters 7, and an alignment step for aligning the phase shifters 7 with the patterned shading layers 4. Usually, an alignment function is not provided in the electron beam exposure unit for patterning the shading layer, so that an electron beam exposure unit provided with this alignment function must be developed.

Therefore, it is difficult to implement the above conventional manufacturing method because a large scale unit is required and the cost is very high.

A second drawback of the method is as follows.

A large amount of mask pattern data and lithography data for alternately arranging the phase shifters is required. Therefore, a large amount of complicated data processing is required to manufacture the above exposure mask.

A third drawback of the method is as follows.

The auxiliary openings 6 must be smaller than the opening 5 to decrease the light intensity. Therefore, in cases where the isolated space section must be the minimum size, the auxiliary openings 6 must be smaller than the minimum size.

A first drawback of the exposure mask is as follows.

Because the phase shifters 7,8 are made by the CVD method, the refractive index of the shifters 7, 8 is not exactly the same as that of the substrate 2 regardless of whether the material of the shifters 7, 8 is the same as that of the substrate 2. Therefore, a multi-reflection is generated between the substrate 2 and the phase shifter 7 (8) so that the intensity of the exposure light transmitted through the phase shifter 7 (8) is smaller than that of the exposure light transmitted through the opening 5 in cases where the line and space sections are formed on the semiconductor device. As a result, the intensity of the dark light passing through the specific paths aligned with the shading layers 4 is not fully decreased.

A second drawback of the exposure mask is as follows.

When the exposure mask is washed by an acid processing solution, the phase shifters 7, 8 are eroded away by the solution because the shifters 7, 8 are not very dense.

Next, three types of conventional exposure mask with a phase-shifting mask, such as a Levenson type, a self-aligned type, and a shift edge type are described.

FIG. 3A is a cross sectional view of a Levenson type of exposure mask with a phase-shifting mask. FIG. 3B shows the amplitude distribution of an exposure light transmitted through the mask shown in FIG. 3A in cases where the light is regarded to be not optically diffracted. FIG. 3C shows the amplitude distribution of an exposure light after the light is optically diffracted by the shading layers shown in FIG. 3A. FIG. 3D shows the intensity distribution of the exposure light of which the amplitude is shown by a solid line in FIG. 3C. FIG. 3E shows space and line sections made on a semiconductor device after the device is exposed by the exposure light transmitted through the exposure mask shown in FIG. 3A.

The Levenson type of exposure mask with a phase-shifting mask shown in FIG. 3A comprises a quartz substrate 11 for transmitting an exposure light, shading layers 12 arranged on the quartz substrate 11 at regular intervals for shading the exposure light transmitted through the substrate 11, phase shifters 13 alternately arranged between the shading layers 12 for shifting the phase of the exposure light transmitted through the substrate 11 by a half wavelength as compared with the phase of the light transmitted through openings 14 alternately arranged between the shading layers 12.

A first exposure light transmitted through both the substrate 11 and the opening 14 is diffracted by the shading layers 12. Therefore, the rectangular amplitude distribution of the first exposure light shown in FIG. 3B is changed to the waveform distribution shown by the upper broken line in FIG. 3C.

On the other hand, the phase of a second exposure light transmitted through both the substrate 11 and the phase shifter 13 is shifted by a half wavelength as compared with the first exposure light transmitted through the opening 14. Simultaneously, the shifted second exposure light is diffracted by the shading layers 12. Therefore, the rectangular amplitude distribution of the second exposure light shown in FIG. 3B is changed to the waveform distribution as shown by the lower broken line in FIG. 3C.

Therefore, these exposure lights are subjected to optical interference with one another so that the amplitude of the interfered light is changed to a superposed pattern shown by the solid line in FIG. 3D.

Accordingly, the light intensity is considerably decreased in an optical path aligned with the shading layers 12 so that the space and line sections can be formed on the semiconductor as shown in FIG. 3E.

The Levenson type of exposure mask is easily manufactured and is utilized to manufacture a semiconductor device provided with line sections and space sections because the phase shifters 13 are alternately arranged between the shading layers 12. Therefore, the exposure mask is not appropriate for manufacturing a semiconductor device provided with the isolated space section.

FIG. 4A is a cross sectional view of a self-aligned type of exposure mask with a phase-shifting mask. FIG. 4B shows the amplitude distribution of an exposure light transmitted through the mask shown in FIG. 4A in cases where the light is regarded to be not optically diffracted. FIG. 4C shows an amplitude distribution of an exposure light after the light is optically diffracted by phase shifters shown in FIG. 4A. FIG. 4D shows an intensity distribution of the exposure light of which the amplitude is shown in FIG. 4C. FIG. 4E shows space and line sections made on a semiconductor device after the device is exposed by the exposure light transmitted through the exposure mask shown in FIG. 4A.

A self-aligned type of exposure mask with a phase-shifting mask shown in FIG. 4A comprises a quartz substrate 21 for transmitting an exposure light, shading layers 22 arranged on the quartz substrate 21 at regular intervals for shading the exposure light transmitted through the substrate 21, phase shifters 23 arranged and overhung by a regular width δ1 on the shading layers 22 for shifting the phase of the exposure light transmitted through the substrate 21 by a half wavelength of the light as compared with the phase of the light transmitted through openings 24 between the overhanging parts of the phase shifters 23.

A first exposure light transmitted through both the substrate 21 and the opening 24 is diffracted by the overhanging parts of the phase shifters 23. Therefore, the rectangular amplitude distribution of the light shown in FIG. 4B is changed to the wave form distribution shown by the upper broken line in FIG. 4C.

On the other hand, the phase of a second exposure light transmitted through both the substrate 21 and the overhanging part of the phase shifter 23 is shifted by a half wavelength as compared with the first exposure light transmitted through the opening 24. Simultaneously, the shifted second exposure light is diffracted by the phase shifter 23. Therefore, the rectangular amplitude distribution of the second exposure light shown in FIG. 4B is changed to a waveform distribution shown by the lower broken line in FIG. 3C. In this case, because the overhanging part of the phase shifter 23 transmitting the second exposure light is a narrow width δ1 such as 0.04 μm, the intensity of the second exposure light is, as is well known, decreased.

Therefore, when these exposure lights are subjected to optical interference with one another in an optical path aligned with the overhanging part of the phase shifter 23, the intensity of the interfered light superimposed on these lights in the optical path is considerably decreased as shown by the solid line in FIG. 4C so that the amplitude of the interfered light is changed to the superimposed pattern shown by the solid line in FIG. 4D.

Accordingly, the light intensity is considerably decreased in an optical path aligned with the phase shifters 23 so that the space and line sections or the isolated space section can be formed on the semiconductor as shown in FIG. 4E.

The self-aligned type of exposure mask is appropriate for manufacturing a semiconductor device provided with the line and space sections or the isolated space section because the phase shifters 23 are arranged on all the shading layers 22, and the interval between the phase shifters 23 can be arbitrarily set.

Therefore, the exposure mask can be utilized in manufacturing any type of semiconductor circuit.

However, the manufacturing steps are complicated because the phase shifters 23 must overhang by the regular width δ1 on the shading layers 22.

FIG. 5A is a cross sectional view of a shift edge type of exposure mask with a phase-shifting mask. FIG. 5B shows the amplitude distribution of an exposure light transmitted through the mask shown in FIG. 5A in cases where the light is regarded to be not optically diffracted. FIG. 5C shows the amplitude distribution of an exposure light after the light is optically diffracted by the phase shifter as shown in FIG. 5A. FIG. 5D shows the intensity distribution of the exposure light for which the amplitude is shown in FIG. 5C. FIG. 5E shows space and line sections made on a semiconductor device after the device is exposed by the exposure light transmitted through the exposure mask shown in FIG. 5A.

A shift edge type of exposure mask with a phase-shifting mask shown in FIG. 5A comprises a quartz substrate 31 for transmitting an exposure light, phase shifters 32 arranged at regular intervals on the quartz substrate 31 for shifting the phase of the exposure light transmitted through the substrate 31 by a half wavelength as compared with the phase of the light transmitted through the openings 33 between the phase shifters 32.

A first exposure light transmitted through both the substrate 31 and the opening 33 is diffracted by the phase shifters 32. Therefore, the rectangular amplitude distribution of the light shown in FIG. 5B is changed to the waveform distribution shown by the upper broken line in FIG. 5C.

On the other hand, the phase of a second exposure light transmitted through both the substrate 31 and the phase shifter 32 is shifted by a half wavelength as compared with the first exposure light transmitted through the opening 33. Simultaneously, the shifted second exposure light is diffracted by the phase shifter 32. Therefore, the rectangular amplitude distribution of the second exposure light shown in FIG. 5B is changed to the waveform distribution shown by the lower broken line in FIG. 5C.

Therefore, when these exposure lights are subjected to optical interference with one another in an optical path aligned with a narrow boundary region between the phase shifter 32 and the opening 33, the intensity of the interfered light superimposed on these lights in the optical path is considerably decreased as shown by the solid line in FIG. 5C so that the amplitude of the interfered light is changed to the superimposed pattern shown by the solid line in FIG. 5D.

Accordingly, a resist layer on a semiconductor device aligned with the narrow boundary is underexposed, so that narrow space sections can be formed on the semiconductor device as shown in FIG. 5E.

The shift edge type of exposure mask can be easily manufactured because no shading layer is provided for the exposure mask.

However, an arranged pattern of the phase shifters 32 differs from a formed pattern of the space sections on the semiconductor device because the space section is produced in specific fields aligned with the narrow boundary. Therefore, the exposure mask can be utilized to manufacture a specific type of semiconductor device.

FIG. 6 is a graphic view showing the resolving power of three types of exposure masks shown in FIGS. 3A, 4A, and 5A, this resolving power being estimated by utilizing an image contrast.

FIG. 7 is a graphic view showing the focus margin of the three types of exposure masks shown in FIGS. 3A, 4A, and 5A, the focus margin being expressed by an image contrast.

The resolving power and the focus margin are estimated using a computer. The resolving power is expressed by the minimum pattern size in FIG. 6. The focus margin is expressed by allowable de-focus values.

As shown in FIG. 6, the minimum pattern size for manufacturing a semiconductor circuit can be estimated by utilizing an image contrast between the dark and bright lights composing the light transmitted through the exposure mask. That is, the minimum pattern size is determined, when the value of the image contrast agrees with an allowable image contrast value.

For example, the minimum pattern size Is estimated to be 0.17 μm for the Levenson and shift edge types of exposure masks (σ=0.2), 0.22 μm for the Levenson type of exposure mask (σ=0.5), 0.27 μm for the self-aligned type of exposure mask (σ1=0.04 μm, σ=0.5), and 0.3 μm for an exposure mask with no phase-shifting mask on condition that a numerical aperture NA equals 0.42 and the wavelength λ of the exposure light equals 248 nm. Here, as is well known, the symbol σ indicates a ratio of the NA of an imaging lens to the NA of a focusing lens.

As shown in FIG. 7, de-focus values can be calculated by utilizing the value of the image contrast estimated in cases where the semiconductor device exposed by an exposure light is arranged out of focus. That is, when the value of the image contrast agrees with the allowable image contrast value, the absolute de-focus value indicates the focus margin.

For example, the focus margin is estimated to be 0.9 μm in the Levenson and shift edge types of exposure masks (σ=0.2), 0.45 μm in the Levenson type of exposure mask (σ=0.5), and 0.35 μm in the self-aligned type of exposure mask (σ1=0.04 μm, σ=0.5), while no focus margin is estimated for the exposure mask with no phase-shifting mask on condition that the numerical aperture NA equals 0.42 and the wavelength λ of the exposure light equals 248 nm.

Therefore, the resolving power and the focus margin are improved to some extent by utilizing the Levenson and shift edge types of exposure masks as compared with the conventional method. Moreover, the resolving power and the focus margin are slightly improved by utilizing the shift edge type of exposure mask.

However, the Levenson type of exposure mask is not appropriate for use in practice because the Levenson type requires a specific arrangement whereby the phase shifters 13 and shading films 12 are repeatedly arranged at regular intervals.

Moreover, all types of exposure masks are made by a chemical vapour deposition (CVD) method in which vapourized silicone oxide ($SiO_2$) is chemically deposited on a quartz substrate to form phase shifters. Therefore, the phase shifters are rapidly formed so that it is difficult to control their thickness. Moreover, it is difficult to uniformly adjust the thickness of all phase shifters because the deposition rate is not uniform over the entire quartz substrate in the CVD method. According to the principle of the phase-shifting method, the unevenness in the thickness of the phase shifters leads to unevenness in the phase of the shifted exposure light, so that the resolving power and the focus margin deteriorate to a considerable extent.

Further, the refractive index of the phase shifter differs from that of the quartz substrate regardless of whether the same material is utilized. Therefore, multi-reflection of exposure light is generated between the quartz substrate and the phase shifter.

SUMMARY OF THE INVENTION

A first object of the present invention is to provide, with due consideration to the drawbacks of such conventional methods, a method for easily manufacturing an exposure mask in which the thickness of the phase shifters is uniformly adjusted.

A second object of the present invention is to provide an exposure mask in which phase shifters resist an acid solution and the refractive index of the phase shifter is exactly the same as that of the quartz substrate.

The first object is achieved by the provision of a method for manufacturing an exposure mask wherein the exposure mask is provided with a substrate for transmitting an exposure light and with phase shifters arranged at prescribed intervals on the substrate for shifting the phase of the exposure light transmitted through the substrate by a half wavelength as compared with the phase of the exposure light transmitted through both the substrate and an opening between the phase shifters, comprising the steps of:

preparing a solution in which a phase shifter material is dissolved;

arranging resist layers at the prescribed intervals on the substrate, the material of the phase shifter being prevented from adhering to the resist layers;

immersing the substrate with the resist layers in the solution containing the phase shifter material;

forming the phase shifters on the substrate between the resist layers to a prescribed thickness by depositing the phase shifter material from the solution;

removing the substrate with the phase shifters from the solution; and removing the resist layers from the substrate to form the openings.

In the above steps, the phase shifter material is slowly deposited on the substrate between the resist layers in the solution so that the phase shifters are formed on the substrate. The deposition speed of the phase shifter is about 1000 Å/Hr so that the speed is very low as compared with that in the CVD method. Moreover, the phase shifters are formed at positions between the resist layers in self-alignment because the phase shifter material cannot adhere to the resist layer.

Thereafter, the resist layers are removed by utilizing, for example, a specific solution reacting to the resist layers and not reacting to the phase shifters. The resist layers can be removed because the phase shifter material is not deposited on the resist layers.

Therefore, a shift edge type of exposure mask which is the same type of the exposure mask shown in FIG. 5 is obtained.

Accordingly, the film thickness of the phase shifter can be accurately controlled because the phase shifter is slowly deposited. Moreover, the phase shifters are uniformly deposited because the phase shifters are deposited in the solution in which the phase shifter material is uniformly dissolved.

Therefore, dark and bright lights composing the light transmitted through the exposure mask can be clearly distinguished because the dark light is considerably decreased in a specific optical path aligned with the boundary region between the phase shifter and the opening after one diffracted exposure light transmitted through both the substrate and the phase shifter is subjected to optical interference with another diffracted exposure light transmitted through both the substrate and the opening. That is, the image contrast between the dark and bright lights shown in FIGS. 6, 7 can be considerably improved.

Moreover, the phase shifters are highly dense as compared with those in the CVD method. As a result, the refractive index of the phase shifter is exactly the same as that of the quartz substrate.

Moreover, the above object is achieved by the provision of a method for manufacturing an exposure mask in which the phase of an exposure light transmitted from a substrate to a phase shifter is shifted by a half wavelength as compared with the phase of the exposure light transmitted from the substrate to an opening between the phase shifters, comprising the steps of:

arranging shading films at prescribed intervals on the substrate, the exposure light transmitted through the substrate being shaded by the shading films;

preparing a solution in which a material of the phase shifter is dissolved;

arranging resist layers on the substrate between the shading films, the phase shifter material being prevented from adhering to the resist layers;

immersing the substrate with the shading films and the resist layers into the solution in which the material of the phase shifter is dissolved;

forming the phase shifters on the shading films between the resist layers to a prescribed thickness by depositing the phase shifter material from the solution;

removing the substrate with the phase shifters from the solution;

removing the resist layers from the substrate to form the openings; and removing a strip of a regular width from both edges of the resist layers, the phase shifters being overhung by the regular width on the shading films.

In the above steps, the phase shifter material is slowly deposited on the shading films between the resist layers in the solution, so that the phase shifters are formed on the shading films. The deposition speed of the phase shifter is about 1000 Å/Hr so that the speed is very low as compared with that in the CVD method. Moreover, the phase shifters are formed at positions between the resist layers in self-alignment because the material of the phase shifter cannot adhere to the resist layer.

Thereafter, the resist layers are removed by utilizing, for example, a specific solution reacting to the resist layers and not reacting to the phase shifters. Then, both edges of the shading films are removed, for example, by a wet etching. That is, the phase shifters overhang the shading films.

Therefore, the self-aligned type of exposure mask which is the same as the exposure mask shown in FIG. 4 is manufactured.

Accordingly, the film thickness of the phase shifter can be accurately controlled because the phase shifter is slowly deposited. Moreover, the phase shifters are uniformly deposited because the phase shifter material is uniformly dissolved in the solution.

Therefore, the dark and bright lights composing the light transmitted through the exposure mask can be clearly distinguished because the dark light is considerably decreased in a specific optical path aligned with the phase shifter after one diffracted exposure light transmitted through both the substrate and the phase shifter is subjected to optical interference with another diffracted exposure light transmitted through both the substrate and the opening. That Is, the image contrast between the dark and bright lights shown in FIGS. 6, 7 can be considerably improved.

Moreover, the phase shifters are highly dense as compared with those in the CVD method. As a result, the refractive index of the phase shifter is exactly the same as that of the quartz substrate.

Further, the above object is achieved by the provision of a method for manufacturing an exposure mask in which the phase of an exposure light transmitted from a substrate to a phase shifter is shifted by a half wavelength as compared with the phase of the exposure light transmitted from the substrate to an opening between the phase shifters, comprising the steps of:

arranging shading films at prescribed intervals on the substrate, the exposure light transmitted through the substrate being shaded by the shading films;

preparing a solution in which a phase shifter material is dissolved;

preparing a specific solution;

arranging resist layers on the substrate, the layers being removable by the specific solution;

underexposing the resist layers to a specific light transmitted from the substrate to the resist layers;

forming exposed resist layers in the internal parts of the resist layers at a regular distance away from the shading films, the exposed resist layers not being removable by the specific solution and to which the phase shifter material does not adhere;

removing the resist layers other than the exposed resist layers by utilizing the specific solution;

immersing the substrate with the shading films and the exposed resist layers in the solution in which the phase shifter material is dissolved;

forming the phase shifters on the shading films and the substrate between the exposed resist layers to a prescribed thickness by depositing the phase shifter material from the solution;

removing the substrate with the phase shifters from the solution; and removing the resist layers from the substrate to form the openings.

In the above steps, the resist layers are exposed to a specific light such as ultra-violet radiation through the substrate. Because the specific light is transmitted between the shading films, the light intensity, as is well known, decreases near the shading films as compared with the internal part of the resist layers. Therefore, in cases where the resist layers is underexposed to the specific light, the resist layers near the shading films are not exposed because a minimum exposure is required to expose the resist layers.

In the present invention, the exposure time of the light is adjusted to form the exposed resist layer at a regular distance from the shading films.

Thereafter, the resist layers not exposed to the specific light are removed. Then, the phase shifter material is slowly deposited on the shading films and the substrate between the exposed resist layers in the solution, so that the phase shifters are formed on the shading films and the substrate. The deposition speed of the phase shifter is about 1000 Å/Hr so that the speed is very low as compared with that in the CVD method. Moreover, the phase shifters are formed positions between the exposed resist layers in self-alignment because the phase shifter material cannot adhere to the exposed resist layers.

Thereafter, the exposed resist layers are removed by utilizing another specific solution reacting to the exposed resist layers and not reacting to the phase shifters.

Therefore, the self-aligned type of exposure mask which is the same as the exposure mask shown in FIG. 4 is obtained.

Accordingly, the film thickness of the phase shifter can be accurately controlled because the phase shifter is slowly deposited. Moreover, the phase shifters are uniformly deposited because the phase shifters are deposited in the solution.

Therefore, the dark and bright lights composing the light transmitted through the exposure mask can be clearly distinguished because the dark light is considerably decreased in a specific optical path aligned with the phase shifter deposited on the substrate after one diffracted exposure light transmitted through both the substrate and the phase shifter is subjected to optical interference with another diffracted exposure light transmitted through both the substrate and the opening. That is, the image contrast between the dark and bright lights shown in FIGS. 6, 7 can be considerably improved.

Moreover, the phase shifters are highly dense as compared with those in the CVD method. As a result, the refractive index of the phase shifter is exactly the same as that of the quartz substrate.

The second object is achieved by the provision of an exposure mask for decreasing the intensity of a part of exposure light by the optical interference of a first diffracted exposure light with a second diffracted exposure light of which the phase is shifted by a half wavelength as compared with the phase of the first diffracted exposure light and for outputting an interfered exposure light alternately arranged by high and low intensity of exposure lights, comprising:

a substrate with a prescribed refractive index for transmitting the exposure light; and phase shifters formed by depositing a material with the prescribed refractive index from a solution in which the material is dissolved at prescribed intervals and to a regular thickness on the substrate for shifting the phase of the exposure light transmitted through the substrate, (1) the first diffracted exposure light being transmitted through both the substrate and an opening between the phase shifters, and (2) the second diffracted exposure light being transmitted through both the substrate and the phase shifter.

In the above configuration of the shift edge type of exposure mask shown in FIG. 5, because the phase shifters are slowly deposited from the solution, the phase shifters are uniformly formed at a regular thickness. Moreover, the phase shifters are highly dense so that the refractive index of the phase shifter becomes exactly the same as that of the substrate.

Accordingly, the bright and dark lights which are generated by optical interference of both the first and second diffracted exposure lights can be clearly distinguished because the phase shifters are uniformly formed at a regular thickness.

Moreover, the exposure light transmitted through the substrate is not reflected by the phase shifter because the refractive index of the phase shifter is exactly the same as that of the substrate. That is, the light intensity of the first diffracted exposure light is exactly the same as that of the second diffracted exposure light so that there is complete interference between the exposure lights.

Moreover, the second object is achieved by the provision of an exposure mask for decreasing the intensity of a part of the exposure light by optical interference of a First diffracted exposure light with a second diffracted exposure light of which the phase is shifted by a half wavelength as compared with the phase of the first diffracted exposure light and for outputting an interfered exposure light alternately arranged by high and low intensity of exposure lights, comprising:

a substrate with a prescribed refractive index for transmitting the exposure light;

shading films initially arranged at first intervals on the substrate, of which the edges are removed to be arranged at second intervals larger than the first intervals for shading the exposure light transmitted through the substrate; and phase shifters formed by depositing a material with a prescribed refractive index, in a solution in which the material is dissolved, at prescribed intervals and to a regular thickness on the shading films arranged at the first intervals for shifting the phase of the exposure light transmitted through the substrate, the first diffracted exposure light being transmitted through both the substrate and an opening between the phase shifters and the second diffracted exposure light being transmitted through both the substrate and the phase shifter.

In the above configuration of the self-aligned type of exposure mask which is the same as the exposure mask shown in FIG. 4, because the phase shifters are slowly deposited in the solution, the phase shifters are uniformly formed to a regular thickness. Moreover, the phase shifters are highly dense so that the refractive index of the phase shifter becomes exactly the same as that of the substrate.

Accordingly, the bright and dark lights which are generated by optical interference between the first and second diffracted exposure lights can be clearly distinguished because the phase shifters are uniformly formed to a regular thickness.

Moreover, the exposure light transmitted through the substrate is not reflected by the phase shifter because the refractive index of the phase shifter is exactly the same as that of the substrate. That is, the light intensity of the first diffracted exposure light is exactly the same as that of the second diffracted exposure light so that there is complete interference between the exposure lights.

Further, the second object is achieved by the provision of an exposure mask for decreasing the intensity of a part of the exposure light by optical interference between a first diffracted exposure light and a second diffracted exposure light of which the phase is shifted by a half wavelength as compared with the phase of the first diffracted exposure light, and for outputting an interfered exposure light alternately arranged by high and low intensity of the exposure lights, comprising:

a substrate with a prescribed refractive index for transmitting the exposure light;

shading films arranged at prescribed intervals on the substrate for shading the exposure light transmitted through the substrate; and phase shifters formed by depositing a material with the prescribed refractive index, from a solution in which the material is dissolved, between exposed resist layers which are formed at a regular distance away from the shading films in internal parts of resist layers arranged on the substrate between the shading films by underexposing the resist layers to a specific light transmitted from the substrate to the resist layers and arranged at prescribed intervals and a regular thickness on the shading films and the substrate for shifting the phase of the exposure light transmitted through the substrate, (1) the resist layers except for the exposed resist layers being removed before the phase shifters are formed between the exposed resist layers, (2) the exposed layers being removed after the phase shifters are formed between the exposed resist layers, (3) the first diffracted exposure light being transmitted through both the substrate and an opening between the phase shifters, and (4) the second diffracted exposure light being transmitted through both the substrate and the phase shifter.

In the above configuration of the self-aligned type of exposure mask which is almost the same as the exposure mask shown in FIG. 4, because the phase shifters are slowly deposited from the solution, the phase shifters are uniformly formed to a regular thickness. Moreover, the phase shifters are highly dense so that the refractive index of the phase shifter becomes exactly the same as that of the substrate.

Accordingly, the bright and dark lights which are generated by optical interference between the first and second diffracted exposure lights can be clearly distinguished because the phase shifters are uniformly formed to a regular thickness.

Moreover, the exposure light transmitted through the substrate is not reflected by the phase shifter because the refractive index of the phase shifter is the same as that of the substrate. That is, the light Intensity of the first diffracted exposure light is exactly the same as that the second diffracted exposure light so that there is completely interference between the exposure lights.

BRIEF DESCRIPTION OF THE DRAWINGS

FIG. 3A is a cross sectional view of a Levenson type of phase-shifting mask.

FIG. 3B shows the amplitude distribution of an exposure light transmitted through the mask shown in FIG. 3A in cases where the light is regarded not to be optically diffracted.

FIG. 3C shows the amplitude distribution of an exposure light after the light is optically diffracted by shading layers shown in FIG. 3A.

FIG. 3D shows the intensity distribution of the exposure light of which the amplitude is shown in FIG. 3C.

FIG. 3E shows space and line sections formed on a semiconductor device after the device is exposed to the exposure light transmitted through the exposure mask shown in FIG. 3A.

FIG. 4A is a cross sectional view of a self-aligned type of phase-shifting mask.

FIG. 4B shows the amplitude distribution of an exposure light transmitted through the mask shown in FIG. 4A in cases where the light is regarded to be not optically diffracted.

FIG. 4C shows the amplitude distribution of an exposure light after the light is optically diffracted by phase shifters shown in FIG. 4A.

FIG. 4D shows the intensity distribution of the exposure light of which the amplitude is shown in FIG. 4C.

FIG. 4E shows space and line sections formed on a semiconductor device after the device is exposed to the exposure light transmitted through the exposure mask shown in FIG. 4A.

FIG. 5A is a cross sectional view of a shift edge type of phase-shifting mask.

FIG. 5B shows an amplitude distribution of an exposure light transmitted through the mask shown in FIG. 5A in cases where the light is regarded to be not optically diffracted.

FIG. 5C shows an amplitude distribution of an exposure light after the light is optically diffracted by the phase shifter shown in FIG. 5A.

FIG. 5D shows an intensity distribution of the exposure light of which the amplitude is shown in FIG. 5C.

FIG. 5E shows space and line sections formed on a semiconductor device after the device is exposed to the exposure light transmitted through the exposure mask shown in FIG. 5A.

DETAILED DESCRIPTION OF THE PREFERRED EMBODIMENTS

The preferred embodiments according to the present invention are described with reference to FIGS. 8 to 11.

FIGS. 8A to 8G are sectional views showing a method for manufacturing a self-aligned type of exposure mask according to a first embodiment of the present invention.

Figure 1A:
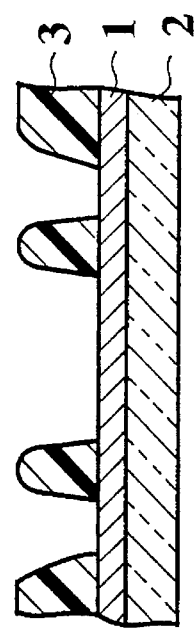
FIGS. 1A, 1C, and 1E are cross sectional views showing a conventional method for manufacturing a conventional exposure mask which is utilized to form line sections and space sections on an exposed semiconductor device.
Figure 1C:
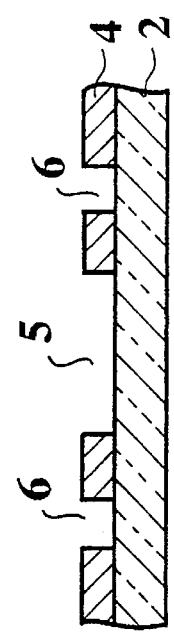
Figure 1E:
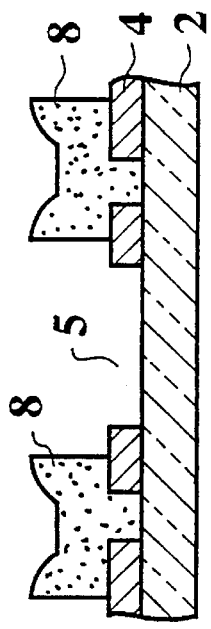
Figure 1B:
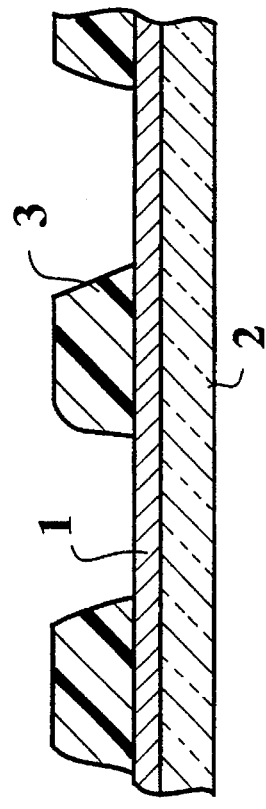
FIGS. 1B, 1D, and 1F are cross sectional views showing another conventional method for manufacturing another conventional exposure mask which is utilized to make an isolated space section on an exposed semiconductor device.
Figure 1D:
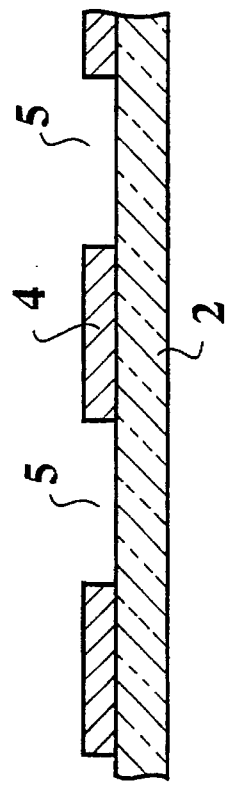
Figure 1F:
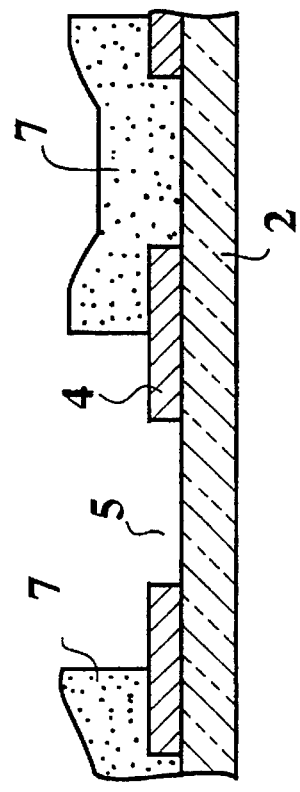
Figure 2B:
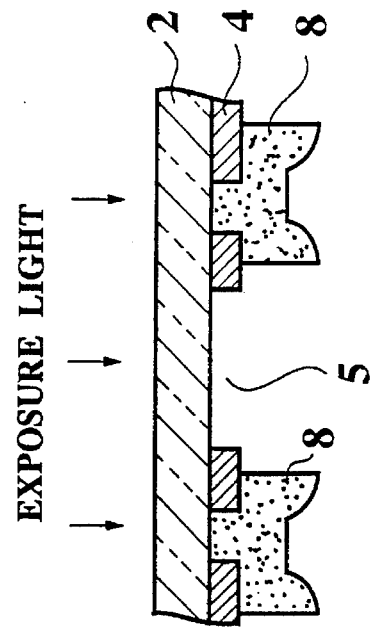
FIGS. 2A, 2B are cross sectional views of the conventional exposure masks manufactured by the method shown in FIGS. 1A to 1F.
Figure 2D:
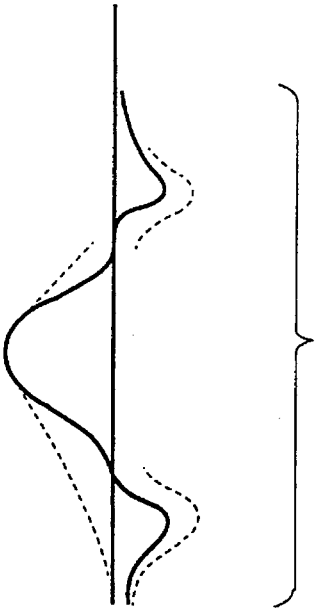
FIGS. 2C, 2D show the amplitude of the exposure lights transmitted from the quartz substrate 2 to the phase shifter 6, 7 or the opening 4.
Figure 2A:
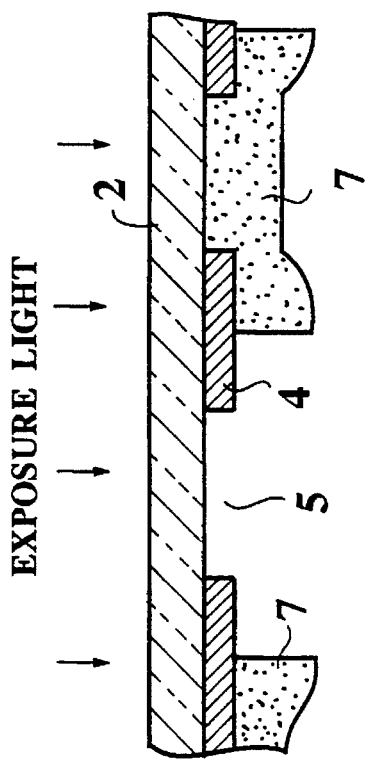
Figure 2C:
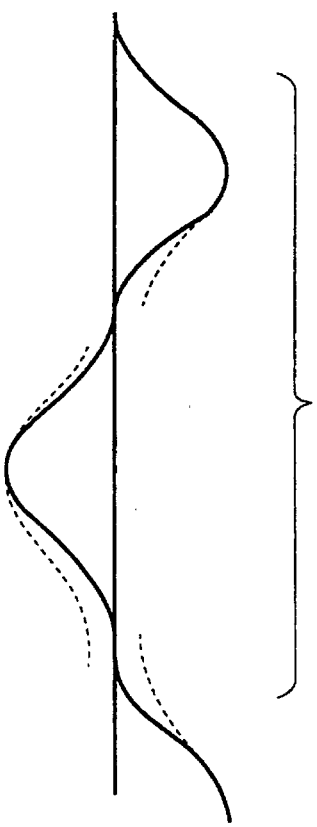
Figure 6:
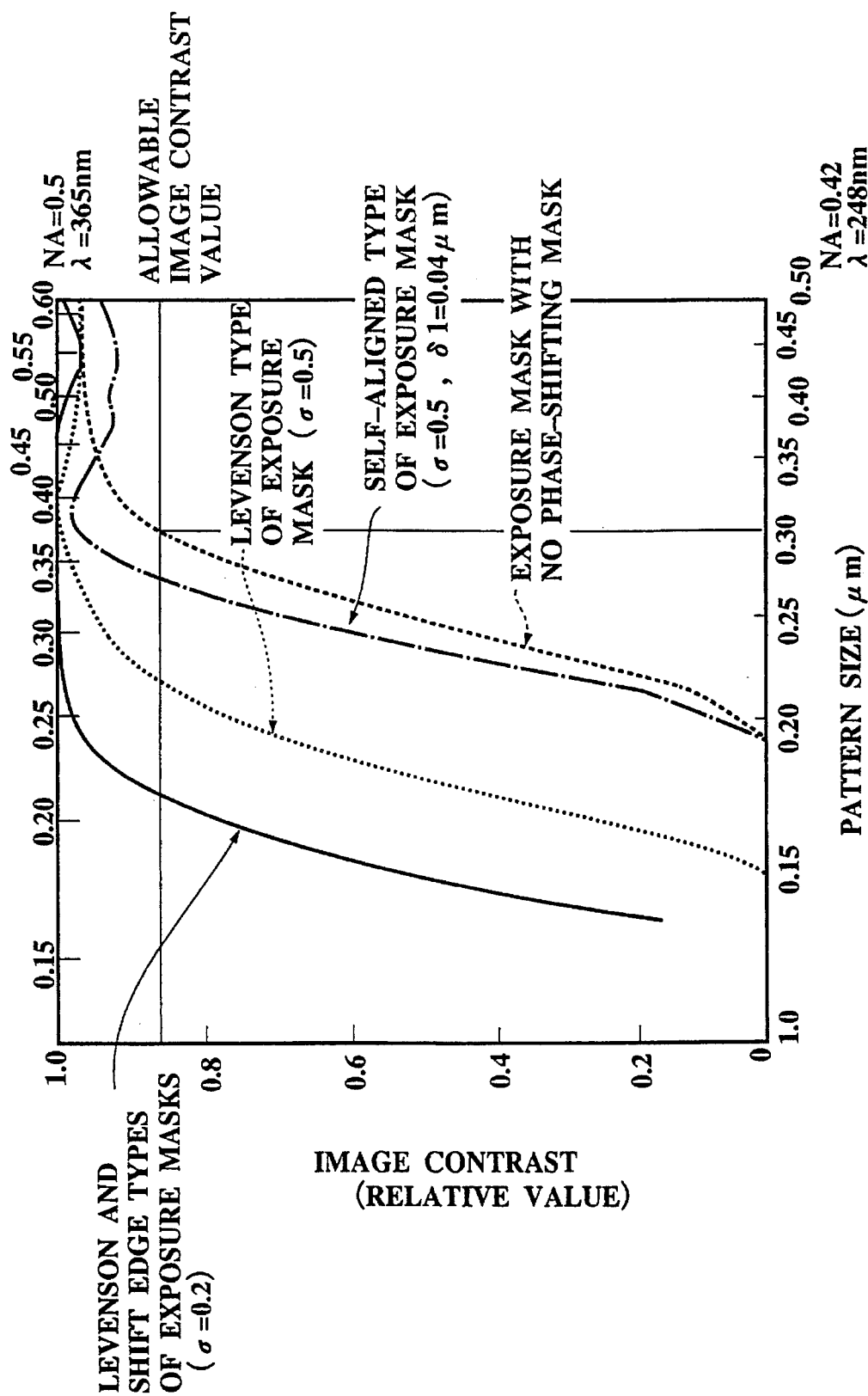
FIG. 6 is a graphic view showing the resolving power of three types of exposure masks shown in FIGS. 3A, 4A, and 5A, the resolving power being estimated by utilizing an image contrast.
Figure 7:
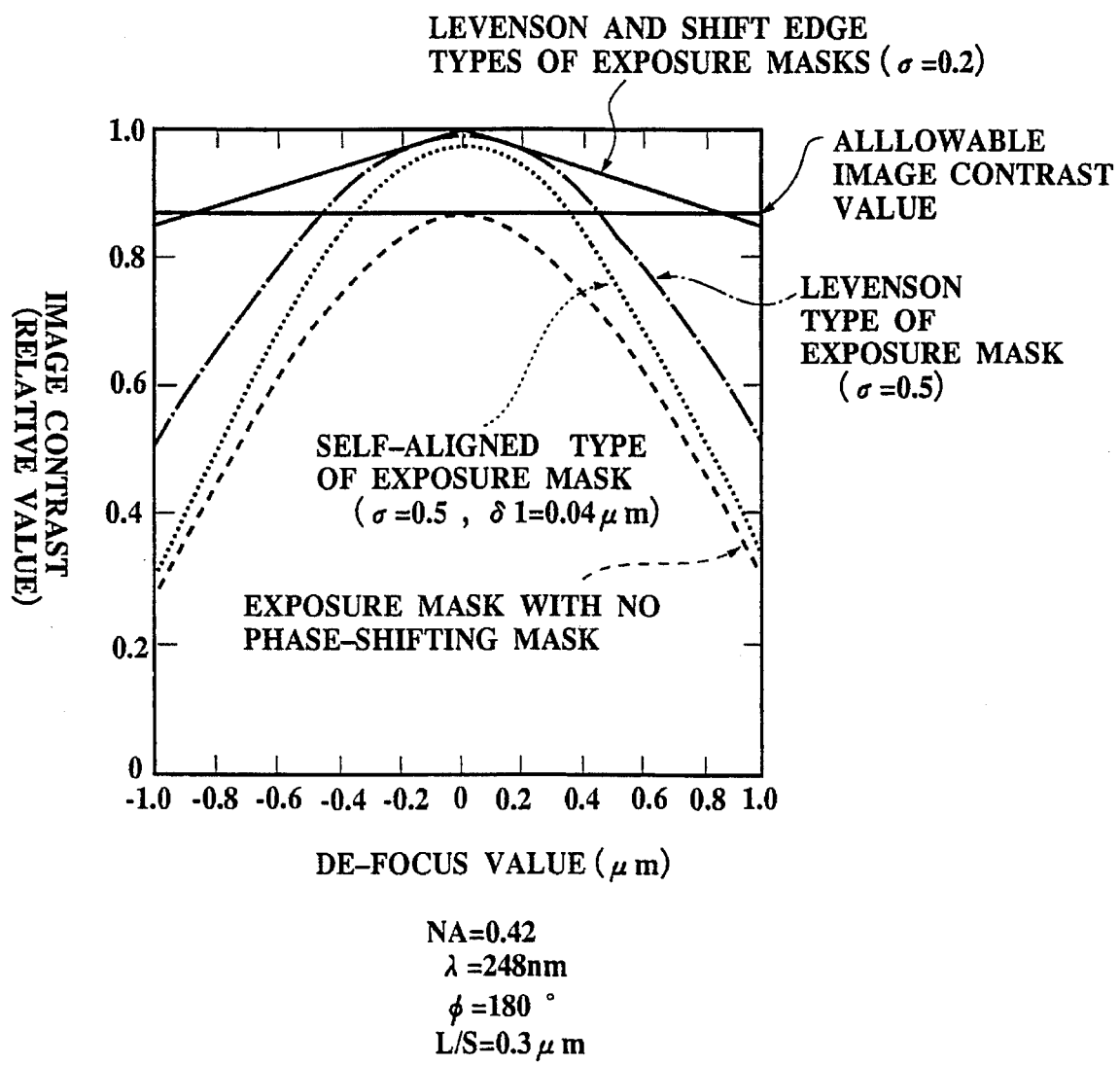
FIG. 7 is a graphic view showing the focus margin of three types of exposure masks shown in FIGS. 3A, 4A, and 5A, the focus margin being estimated by utilizing an image contrast.
Figure 8A:
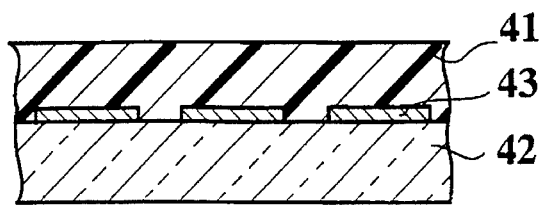
FIGS. 8A to 8G are sectional views showing a method for manufacturing a self-aligned type of exposure mask according to a first embodiment of the present invention.

As shown in FIG. 8A, a negative type of resist layer 41 in which one of the principal components is a p-hydroxystyrene is rotationally applied to the surface of a quartz substrate 42 on which shading films 43 are attached. The thickness of the resist layer 41 is about 12000 Å. Then, the quartz substrate 42 applied the resist layer 41 is baked for one minute at a temperature of 120° C.

Figure 8B:
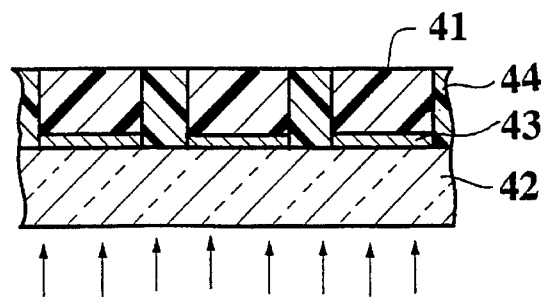

Thereafter, as shown in FIG. 8B, the quartz substrate 42 and the resist layer 41 are irradiated by a light generated by a Xe-Hg lamp. That is, a light of which the wavelength is in the range from 2400 Å to 3000 Å is applied from the back of the quartz substrate 42 (shown by arrows) to the resist layer 41 for about 5 minutes. As a result, parts of the resist layer 41 are not shaded by the films 43, so that latent image layers 44 are formed on the parts of the exposed resist layer 41.

Figure 8C:
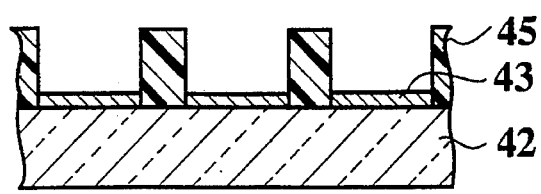

Thereafter, the latent image layers 44 are developed in a developer for 2 minutes to form exposed resist layers 45. The developer is a solution including 2.38 wt % tetramethylammonium hydroxide. Then, as shown in FIG. 8C, no exposed resist layers on the shading films 43 are removed from the resist layer 41, so that a stripe pattern of the exposed resist layers 45 is formed on the quartz substrate 42 between the shading films 43.

Figure 8D:
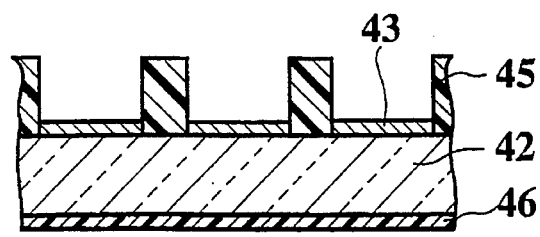

Thereafter, a solution in which one of the principal components is a poly-vinyl acetate is sprayed onto the back surface of the quartz substrate 42 and onto all sides of the quartz substrate 42. Then, the quartz substrate 42 sprayed with the solution is dried in the atmosphere, so that a protective layer 46 made of the sprayed solution is formed as shown in FIG. 8D. The protective layer 46 protects the quartz substrate 42 from being eroded by an acid solution utilized in a silicon-oxide-at-room-temperature-deposition (SORD) method.

Figure 8E:
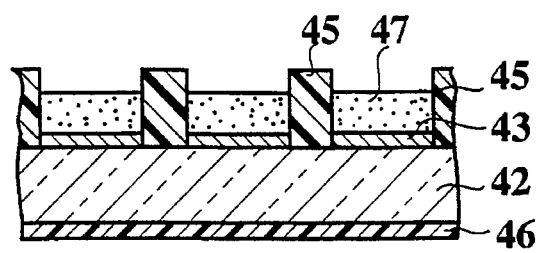

Thereafter, as shown in FIG. 8E, silicon dioxide films 47 are formed on the shading films 43 between the exposed resist layers 45 by utilizing the SORD method. The SORD method is described in detail as follows.

The quartz substrate 42 with the exposed resist layers 45 and the protective layer 46 is immersed in a hydro silicofluoric acid ($H_2SiF_6$) solution in which a silicon dioxide ($SiO_2$) is dissolved at saturation. Then, a boric acid ($H_3BO_3$) solution is added in the hydro silicofluoric acid solution. The concentration of the boric acid solution is, for example, 0.5 mol/l and the mixed solution is maintained at a temperature of 35° C.

As a result, as shown in FIG. 8E, the silicon dioxide films 47 are deposited in self-alignment on the shading films 43 between the exposed resist layers 45. The thickness of the silicon dioxide films 47 is exactly 2400 Å.

Because the exposed resist layers 45 are an organic substance, the silicon dioxide which is not an organic substance is not deposited on the exposed resist layers 45. Therefore, the silicon dioxide films 47 are selectively positioned between the exposed resist layers 45.

Moreover, the silicon dioxide films 47 are slowly formed at a rate of about 1000 Å/Hr. Further, the concentration of the hydro silicofluoric acid and the boric acid is uniformly maintained over the entire mixed solution because these acids react slowly.

The thickness of the silicon dioxide films 47 is set at $\lambda/2(n-1)$ because the films 47 are utilized to shift an exposure light by a half wavelength when the exposure mask with the films 47 is utilized to manufacture a semiconductor integrated circuit in an exposure step. That is, the films 47 are utilized as the phase shifters shown in FIG. 4. Here, the symbol $\lambda$ indicates the wavelength of the exposure light and the symbol n indicates the refractive index of the silicon dioxide films 47.

In this embodiment, the refractive index of the silicon dioxide films 47 equals 1.5 (n=1.5). Because the quartz substrate 42 is made of the silicon dioxide, the refractive index of the substrate 42 is the same as that of the films 47. The exposure light is generated by a KrF excimer laser source. The wavelength of the exposure light is 2400 Å ($\lambda$=2400 Å). Therefore, the thickness of the films 47 is set at 2400 Å.

Figure 8F:
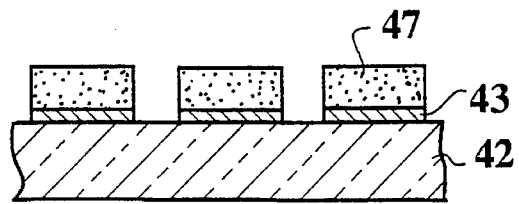

Thereafter, the quartz substrate 42 with the deposited silicon dioxide films 47 is disposed in a resist ashing unit with an oxygen gas plasma generating system. The substrate 42 is exposed to the oxygen gas plasma in the unit for 30 minutes so that the exposed resist layers 45 and the protective layer 46 are ashed and removed as shown in FIG. 8F.

Figure 8G:
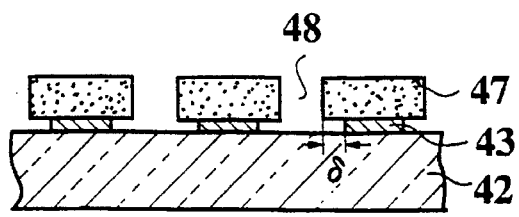

Thereafter, the edges of the shading films 43 are etched for 6 seconds by utilizing a chromium etching solution according to an isotropic wet etching method. Therefore, the silicon dioxide films 47 overhang the shading films 43 by a 0.04 μm width ($\delta$=0.04 μm) as shown in FIG. 8G. The overhanging portions in the silicon dioxide films 47 function as the phase shifter described in FIG. 4.

When the width of the overhanging portion is 0.04 μm on the shading films 43, one exposure light transmitted through both the substrate 42 and the silicon dioxide film 47 optically interferes with another exposure light transmitted through both the substrate 42 and an opening 48 between the silicon dioxide films 47. That is, as is well known, a stripe pattern which is formed by alternately arranging dark and bright lights composing the exposure light transmitted through the exposure mask shown in FIG. 8G is very clear.

As mentioned above, the self-aligned type of exposure mask is manufactured by utilizing the SORD method.

In the exposure mask manufactured by utilizing the SORD method, the exposed resist layers 45 can be ashed and removed by utilizing the ashing unit without being disturbed by the silicon dioxide because the silicon dioxide is not deposited on the exposed resist layers 45.

Because the silicon dioxide dissolved in the mixed solution is positioned on the shading films 43 in self-alignment before the edges of the shading films 43 are etched, the silicon dioxide films 47 can be easily arranged at prescribed intervals on the shading films 43. That is, a large-scale electron beam unit with an alignment system is not required to manufacture the exposure mask according to this embodiment, so that a large quantity of data and complicated data processing are not required.

In addition, because the self-aligned type of exposure mask is manufactured, no auxiliary opening is required to form phase shifters such as the silicon dioxide films 47 regardless of whether or not the isolated space section is formed on the semiconductor device.

Also, because the silicon dioxide films 47 are slowly deposited, the thickness of the silicon dioxide films 47 can be precisely adjusted.

Because the concentration of the hydro silicofluoric acid and the boric acid is uniformly maintained over the entire mixed solution, the silicon dioxide can be uniformly deposited over the entire quartz substrate 42. That is, all the silicon dioxide films 47 can be precisely adjusted to the same thickness.

Because the SORD method is implemented at a room temperature of, for example, 35° C., safe work can be guaranteed and the work can be easily implemented.

Also, the silicon dioxide films 47 are highly dense because the SORD method is utilized as compared with the CVD method. Therefore, the acid resisting properties of the films 47 is superior to the phase shifters formed by the CVD method. Moreover, the refractive index of the silicon dioxide films 47 is exactly the same as that of the quartz substrate 42, while the phase shifter 23 formed by the CVD method is not exactly the same as the quartz substrate 21, as shown in FIG. 4.

Next, the exposure mask manufactured by utilizing the SORD method was attached to a KrF excimer laser stepper with a project lens of NA=0.42. Then, the exposure light generated by the KrF excimer laser source was exposed to a novolak type of positive resist of a thickness of 0.5 μm, applied on a semiconductor device. As a result, a striped pattern in which light and dark light fields are alternately arranged at 0.2 μm intervals is precisely obtained on the semiconductor device. Moreover, the striped pattern was reproduced.

Accordingly, the resolving power of the stepper utilizing the exposure mask manufactured by utilizing the SORD method is 0.2 μm, while the resolving power in the conventional self-aligned type of the exposure mask shown in FIG. 4 is 0.27 μm.

The reason that the resolving power is improved is because the thickness of the silicon dioxide films 7 can be precisely and uniformly adjusted and their density is increased.

Therefore, when a semiconductor circuit is manufactured in an exposure step, the striped pattern can be precisely obtained by utilizing the exposure mask manufactured by utilizing the SORD method.

Next, a second embodiment of the present invention is described with reference to FIGS. 9A to 9E.

FIGS. 9A to 9E are sectional views showing a method for manufacturing another self-aligned type of exposure mask according to a second embodiment of the present invention.

Figure 9A:
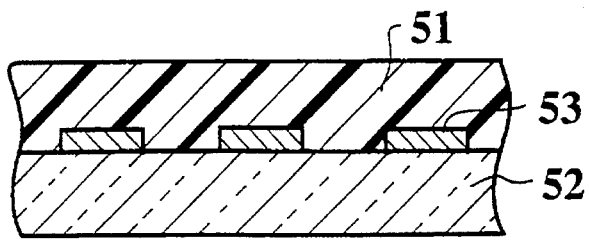
FIGS. 9A to 9E are sectional views showing a method for manufacturing another self-aligned type of exposure mask according to a second embodiment of the present invention.

As shown in FIG. 9A, a negative type of resist layer 51 in which one of the principal components is a cresol novolak resin is rotationally applied to the surface of a quartz substrate 52 on which shading films 53 formed from chromium thin films are attached. The thickness of the resist layer 51 is about 13000 Å. Then, the quartz substrate 52 coated with the resist layer 51 is baked for one minute at a temperature of 90° C.

Figure 9B:
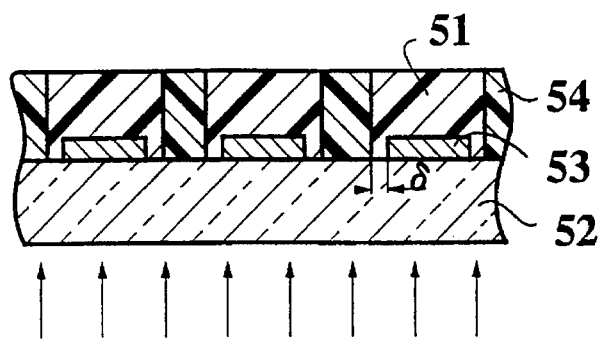

Thereafter, as shown in FIG. 9B, the quartz substrate 52 and the resist layer 51 are irradiated by a light generated by a Xe-Hg lamp. That is, a light with a wavelength in the range from 2400 Å to 3000 Å is applied from the back of the quartz substrate 52 (shown by arrows) to the resist layer 51. In this case, the intensity of the light is, as is well known, strongest in the center between the shading films 53 and is decreased as the interval from the shading films 53 becomes smaller. Moreover, the minimum exposure of light is required to expose all the resist layer 51 between the shading films 53 in the same manner as in the first embodiment. In this embodiment, the resist layer 1 is exposed to the light at less than the minimum exposure. As a result, the resist layer 51 is not exposed within the interval of 0.04 μm ($\delta$=0.04 μm) from the shading film 53 because of the underexposure. Therefore, latent image layers 54 are formed by the exposed resist layer 51 in a separate region exceeding the interval of 0.04 μm from the shading films 53.

Figure 9C:
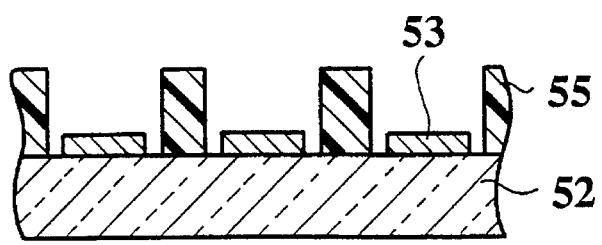

Thereafter, the latent image layers 54 are developed to form exposed resist layers 55 in a developer including 2.38 wt % tetra-methyl-ammonium hydroxide for 2 minutes. Then, as shown in FIG. 9C, no exposed resist layers are removed from the resist layer 51, so that a striped pattern of the exposed resist layers 55 is formed on the quartz substrate 52 between the shading films 53.

Thereafter, a protective layer 56 made of a poly-vinyl acetate is sprayed onto the back surface of the quartz substrate 52 and onto all sides of the quartz substrate 52 and is baked in the same manner as the protective layer 46 in the first embodiment.

Figure 9D:
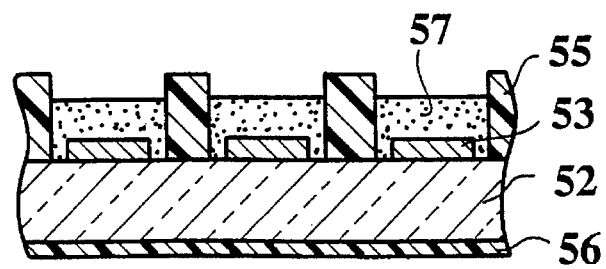

Thereafter, as shown in FIG. 9D, silicon dioxide films 57 are formed on the shading films 53 and the quartz substrate 52 between the exposed resist layers 55 by utilizing the SORD method in the same manner as in the first embodiment. The silicon dioxide films 57 formed on the quartz substrate 52 function as the phase shifter described in FIG. 4.

Thereafter, the SORD method is implemented in the same manner as in the first embodiment. That is, the quartz substrate 52 with the exposed resist layers 55 and the protective layer 56 is immersed in the hydro silicofluoric acid solution. Then, the 0.5 mol/l boric acid solution is added to the hydro silicofluoric acid solution. The mixed solution is maintained at a temperature of 35° C. Then, the silicon dioxide films 57 are slowly deposited in self-alignment between the exposed resist layers 55 at a rate of about 1000 Å/Hr. The thickness of the silicon dioxide films 57 is exactly 2400 Å. Therefore, the exposure light generated by a KrF excimer laser source is shifted by a half wavelength when the exposure light is transmitted through the films 57 as compared with the exposure light not transmitted through the films 57 because the refractive index of the silicon dioxide films 47 is 1.5 (n=1.5) and the wavelength of the exposure light is 2400 Å ($\lambda$=2400 Å).

Figure 9E:
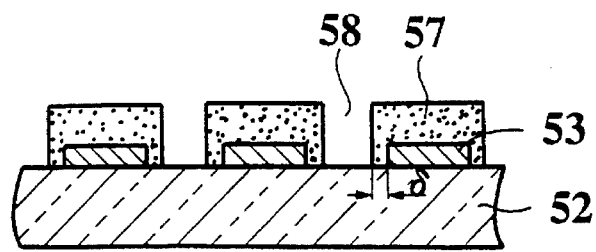

Thereafter, the exposed resist layers 55 and the protective layer 56 are ashed and removed as shown in FIG. 9E in the same manner as in the first embodiment. Therefore, openings 58 are formed between the silicon dioxide films 57 after the exposed resist layers 55 are removed. The exposed resist layers 55 overhanging from the shading films 53 are arranged on the quartz substrate 52 at a 0.04 μm width ($\sigma$=0.04 μm).

As mentioned above, the self-aligned type of exposure mask is manufactured by utilizing the SORD method.

In the exposure mask manufactured by utilizing the SORD method according to the second embodiment, one exposure light transmitted through the substrate 52 and the silicon dioxide film 57 arranged on the substrate 52 at the 0.04 μm width is diffracted by the film 57. Moreover, another exposure light transmitted through the substrate 52 and the opening 58 between the silicon dioxide films 57 width is diffracted by the films 57. The phase of one exposure light differs from that of the other exposure light by a half wavelength.

Therefore, both exposure lights are subjected to optical interference so that a striped pattern formed by bright and dark lights is formed in the outgoing exposure light.

Accordingly, because the phase shifters of 0.04 μm width can be easily manufactured by decreasing the intensity of the light generated by the Xe-Hg lamp, the wet etching implemented in the first embodiment is not required. The manufacturing method according to the second embodiment can therefore be simplified.

Because the light exposure can be strictly adjusted as compared with the adjustment of the wet etching rate in the first embodiment, the width of the phase shifters can be precisely adjusted.

In addition, the exposed resist layers 55 can be ashed and removed by utilizing the ashing unit without being disturbed by the silicon dioxide because the silicon dioxide is not deposited on the exposed resist layers 55.

Also, because the silicon dioxide dissolved in the mixed solution is positioned on the shading films 53 and the substrate 52 in self-alignment between the exposed resist layers 55, the silicon dioxide films 57 can be easily arranged on the substrate 52 at a 0.04 μm width. That is, a large-scale electron beam unit with an alignment system is not required to manufacture the exposure mask according to this embodiment, so that a large quantity of data and complicated data processing are not required.

In addition, because the self-aligned type of exposure mask is manufactured, no auxiliary opening is required to form phase shifters such as the silicon dioxide films 57 regardless of whether or not the isolated space section are formed on the semiconductor device.

Because the silicon dioxide films 57 are slowly deposited, the thickness of the silicon dioxide films 57 can be precisely adjusted.

Moreover, because the concentration of the hydro silicofluoric acid and the boric acid is uniformly maintained over the entire mixed solution, the silicon dioxide can be uniformly deposited over the entire quartz substrate 52. That is, all the silicon dioxide films 57 can be precisely adjusted to the same thickness.

Further, because the SORD method is implemented at a room temperature of, for example, 35° C., safe work can be guaranteed and the work can be easily implemented.

The silicon dioxide films 57 are highly dense because the SORD method is utilized as compared with the CVD method. Therefore, the acid resisting properties of the films 57 are superior to those of the phase shifters formed by the CVD method. Moreover, the refractive index of the silicon dioxide films 57 is exactly the same as that of the quartz substrate 52, while the phase shifter 23 formed by the CVD method is not exactly the same as the quartz substrate 21 as shown in FIG. 4.

Next, the exposure mask manufactured by utilizing the SORD method according to the second embodiment was attached to the KrF excimer laser stepper with the project lens of NA=0.42 and the exposure light was exposed to the novolak type of positive resist of 0.5 µm thickness to examine the resolving power in the same manner as in the first embodiment.

As a result, the resolving power of the stepper utilizing the exposure mask manufactured by utilizing the SORD method is 0.2 µm in the same manner as in the first embodiment.

Therefore, when a semiconductor circuit is manufactured in an exposure step, the striped pattern can be precisely obtained by utilizing the exposure mask manufactured by utilizing the SORD method in the same manner as in the first embodiment.

Next, a third embodiment of the present invention is described.

The negative type of resist layer 51 is rotationally applied to the surface of the quartz substrate 52 on which the shading films 53 are attached and baked in the same manner as in the second embodiment.

Thereafter, the latent image layers 54 are formed in the internal portion of the resist layer 51 and are developed, then a striped pattern of the exposed resist layers 55 is formed on the quartz substrate 52 between the shading films 53 and the protective layer 56 is formed in the same manner as in the second embodiment.

Subsequently, silicon dioxide films 59 are formed on the shading films 53 and the quartz substrate 52 between the exposed resist layers 55 by utilizing a modified SORD method. The silicon dioxide films 59 formed on the quartz substrate 52 function as the phase shifter described in FIG. 4.

The modified SORD method is described in detail as follows.

The quartz substrate 52 with the exposed resist layers 55 and the protective layer 56 is immersed in the hydro silicofluoric acid ($H_2SiF_6$) solution which is controlled at a temperature of 5° C.

When the temperature of the solution is relatively low, for example, 5° C., the precipitation of the silicon dioxide is small. However, as the temperature of the solution is increased, the precipitation of the silicon dioxide is promoted and the volume of the precipitation is increased.

Thereafter, the temperature of the solution is gradually increased to 60° C. Therefore, the precipitation of the silicon dioxide is continued so that the silicon dioxide films 57 are deposited in self-alignment on the shading films 53 between the exposed resist layers 55 and are strictly adjusted to a thickness of 2400 Å.

The silicon dioxide films 57 are slowly formed at a rate of about 1000 Å/Hr. Moreover, the concentration of the hydrosilicofluoric acid is uniformly maintained over the entire solution because the acid is slowly reacted.

Thereafter, the exposed resist layers 55 and the protective layer 56 are ashed and removed in the same manner as in the second embodiment.

Openings 58 are therefore formed between the silicon dioxide films 57 after the exposed resist layers 55 are removed, and the exposed resist layers 55 are arranged on the quartz substrate 52 at a 0.04 µm width.

As mentioned above, the self-aligned type of exposure mask is manufactured by utilizing the modified SORD method according to the third embodiment.

Accordingly, because the precipitation of the silicon dioxide is continued by increasing the temperature of the solution so that the silicon dioxide films 57 are deposited, no added solution is required to promote and continue the precipitation of the silicon dioxide. Therefore, no impurities are added in solution so that mask defects resulting from impurities can be avoided.

Moreover, the remaining features and the resolving power of the exposure mask manufactured by the method according to the third embodiment are the same as those in the second embodiment.

The modified SORD method can be applied to the method according to the first embodiment in place of the SORD method.

Although the SORD method and the modified SORD method are utilized in the first to third embodiments, it is preferable that pieces of aluminium metal be added to the hydro-silicofluoric acid ($H_2SiF_6$) solution in place of the addition of the boric acid solution in the SORD method or the increase of the temperature in the modified SORD method. A further modified SORD method for manufacturing an exposure mask by adding pieces of aluminium metal is described in detail as follows.

The quartz substrate 42 (52) with the exposed resist layers 45 (55) and the protective layer 46 (56) is immersed in the hydro silicofluoric acid ($H_2SiF_6$) solution which is maintained at a temperature of 35° C. Then, for example, pieces of aluminium metal are added to the hydrosilicofluoric acid solution.

As a result, hydrogen fluoride (HF) is gradually decomposed so that the silicon dioxide films 47 (57, 59) can be continuously deposited.

Moreover, though the negative type of resist layer 41 (51) is utilized in the first to third embodiments, it is preferable that a positive type of resist layer be utilized in place of the negative type of resist layer 41 (51) because the resist layer is removed to form the openings 48 (58) between the shading films 43 (53). An image reversal method in which a positive type of resist layer such as novolak including an aromatic amine compound is described as follows.

A positive type of novolak resin including an aromatic amine compound is rotationally applied to the surface of a quartz substrate 42 (52) on which shading films 43 (53) formed from chromium thin films are attached. The thickness of the positive type of novolak is about 12000 Å. Then, the quartz substrate 42 (52) applied the positive type of novolak is irradiated by an ultraviolet light from the back of the substrate 42 (52). Thereafter, the positive type of novolak irradiated by the light is baked for 10 minutes at a temperature of 120° C.

Thereafter, the positive type of novolak is irradiated by an ultraviolet light from the surface thereof so that the positive type of novolak on the shading films 43 (53) is exposed. Then, the exposed novolak is developed and removed. Therefore, no exposed novolak remains between the shading films 43 (53).

Moreover, it is preferable that the surface of the exposed resist layers 45 (55) be fluoridized prior to the deposition of the silicon dioxide films 47 (57, 59). In this case, the adhesive strength of the layers 45 (55) to the films 47 (57, 59) is lowered by the fluoridization of the layers 45 (55). As a result, The exposed resist layers 45 (55) can be easily removed after the silicon dioxide films 47 (57, 59) are deposited.

Next, a fourth embodiment of the present invention is described with reference to FIGS. 10A to 10D.

FIGS. 10A to 10D are sectional views showing a method for manufacturing an exposure mask according to the fourth embodiment.

Figure 10A:
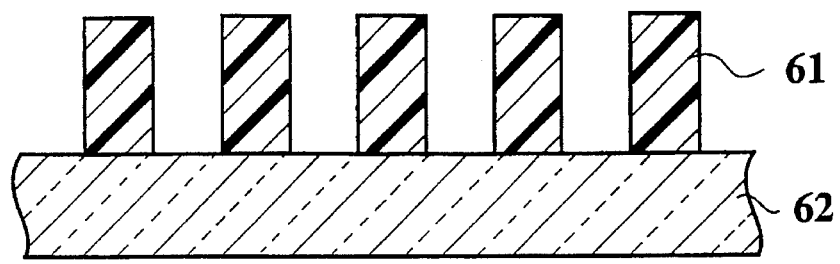
FIGS. 10A to 10D are sectional views showing a method for manufacturing an exposure mask according to the fourth embodiment.
Figure 10B:
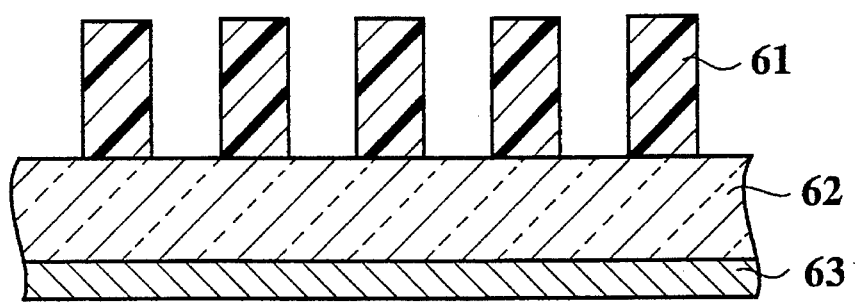

As shown in FIG. 10A, resist layers 61 are arranged to form a striped pattern on a transparent quartz substrate 62 by utilizing an electron beam patterning method. The resist layers 61 is about 1 µm thick. Moreover, a resist layer 63 is coated onto the back of the quartz substrate 62 and the sides of the quartz substrate 62 as shown in FIG. 10B. The resist layer 63 is coated by a resist coater or by hand to protect the substrate 62 from being eroded by the acid solution utilized in the SORD method.

Thereafter, the SORD method is implemented in the same manner as in the first method. That is, the quartz substrate 62 with the resist layers 61 is immersed in the hydro-silicofluoric acid solution. Then, the boric acid solution is added in the hydro-silicofluoric acid solution. The concentration of the boric acid solution is 0.5 mol/l and the mixed solution is maintained at a temperature of 35° C.

Figure 10C:
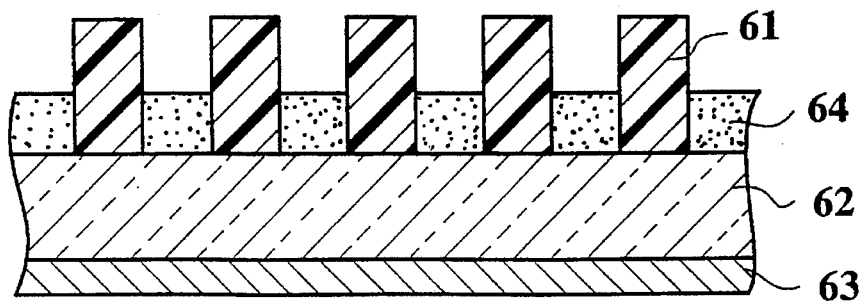

As shown in FIG. 10C, silicon dioxide films 64 are therefore deposited in self-alignment on the substrate 62 between the resist layers 61. At this time, the silicon dioxide is not deposited on the resist layers 61 because the layers 61 are made of an organic substance.

The silicon dioxide films 64 are exactly $\lambda/2(n-1)$ µm thick in the same manner as in the first method. Therefore, the silicon dioxide films 64 function as the phase shifters shown in FIG. 5.

Figure 10D:
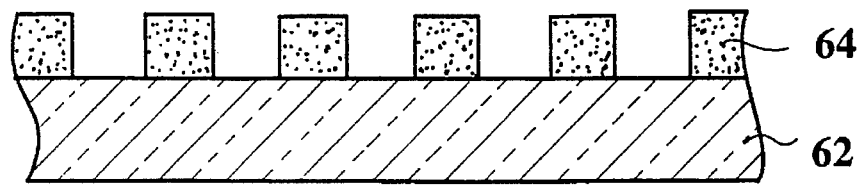

Thereafter, the resist layers 61, 63 are removed by immersing the substrate 62 with the deposited silicon dioxide films 64 in a removal solution such as sulfuric acid. Therefore, as shown in FIG. 10D, a shift edge type of exposure mask comprising the silicon dioxide films 64 functioning as the phase shifters and the quartz substrate 62 is manufactured.

In the shift edge type of exposure mask manufactured by the method according to the fourth embodiment, the resist layers 61 can be removed by the sulfuric acid without being disturbed by the silicon dioxide because the silicon dioxide is not deposited on the resist layers 61.

Moreover, because the silicon dioxide dissolved in the mixed solution is positioned on the quartz substrate 62 between the resist layers 61 in self-alignment, the silicon dioxide films 64 can be easily arranged at prescribed intervals on the substrate 62. That is, a large-scale electron beam unit with an alignment system is not required to manufacture the exposure mask according to this embodiment, so that a large quantity of data and complicated data processing are not required.

Because the silicon dioxide films 64 are slowly deposited, the thickness of the silicon dioxide films 64 can be precisely adjusted.

Because the concentration of the hydro silicofluoric acid and the boric acid is uniformly maintained over the entire mixed solution in the same manner as in the first embodiment, the silicon dioxide can be uniformly deposited over the entire quartz substrate 62. That is, all the silicon dioxide films 64 can be precisely adjusted to the same thickness.

Also, because the SORD method is implemented at a room temperature of, for example, 35° C., safe work can be guaranteed and the work can be easily implemented.

The silicon dioxide films 64 are highly dense because the SORD method is utilized as compared with the CVD method. Therefore, the acid resisting properties of the films 64 are superior to those of the phase shifters formed by the CVD method. Moreover, the refractive index of the silicon dioxide films 64 is exactly the same as that of the quartz substrate 62, while the phase shifter 32 formed by the CVD method is not exactly the same as the quartz substrate 31 as shown in FIG. 5. Further, the silicon dioxide films 64 do not change in size regardless of whether or not the exposure mask is utilized for a long time.

In the fourth embodiment, though the SORD method is utilized, it is preferable that the modified SORD method be utilized in the same manner as in the second embodiment in place of the SORD method.

Moreover, it is preferable that the further modified SORD method be utilized.

Next, a fifth embodiment of the present invention is described with reference to FIGS. 11A to 11D.

FIGS. 11A to 11D are sectional views showing a method for manufacturing an exposure mask integrally formed by both a shift edge type of phase-shifting mask and no phase-shifting mask according to the fifth embodiment.

Figure 11A:
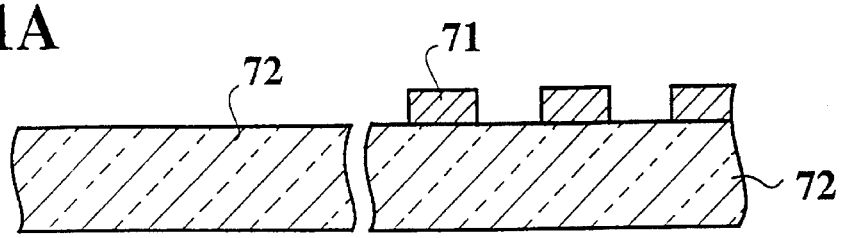
FIGS. 11A to 11D are sectional views showing a method for manufacturing an exposure mask integrally formed by both a shift edge type of phase-shifting mask and no phase-shifting mask according to the fifth embodiment.

As shown in FIG. 11A, shading films 71 are arranged at prescribed intervals to form a striped pattern on a first part of a quartz substrate 72. The first part of the substrate 72 is processed to produce an exposure mask with no phase-shifting mask. On the other hand, no shading film is arranged on the second part of quartz substrate 72. The second part of the quartz substrate 72 is processed to produce a shift edge type of phase-shifting mask.

Figure 11B:
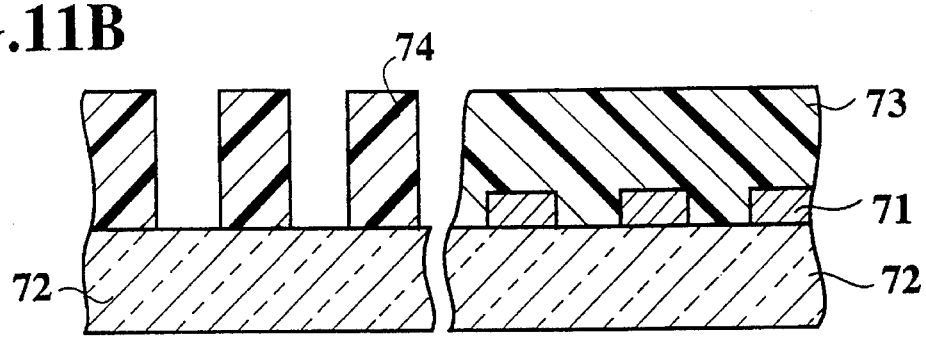

The shading films 71 are made of chromium or chromium oxide. The striped pattern arranged by the shading films 71 is formed by an electron beam patterning method. Thereafter, a resist layer 73 is coated over the entire quartz substrate 72. The resist layer 73 is about 1 µm thick. Then, as shown in FIG. 11B, the resist layer 73 on the second part of quartz substrate 72 is etched to form a prescribed striped pattern of resist layers 74 by the electron beam patterning method.

Figure 11C:
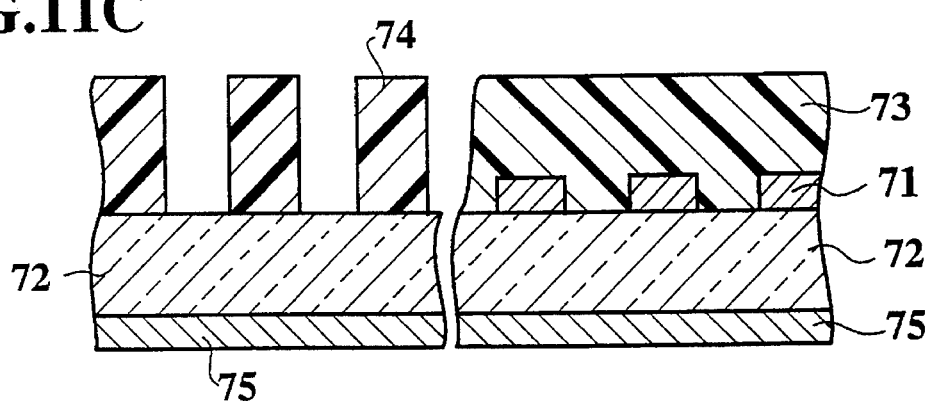

Moreover, as shown in FIG. 11C, a resist layer made of chromium or chromium oxide is coated onto the back of the substrate 72 and the sides of the substrate 72 to form protective layers 75. The protective layers 75 protect the substrate 72 from being eroded by an acid solution when the SORD method is implemented. The coating is implemented by a resist coater or by hand.

Thereafter, the SORD method is implemented in the same manner as in the first method. That is, the quartz substrate 72 with the resist layers 74 is immersed in the hydro-silicofluoric acid solution. Then, the boric acid solution is added to the hydro silicofluoric acid solution. The concentration of the boric acid solution is 0.5 mol/l and the mixed solution is maintained at a temperature of 35° C.

Figure 11D:
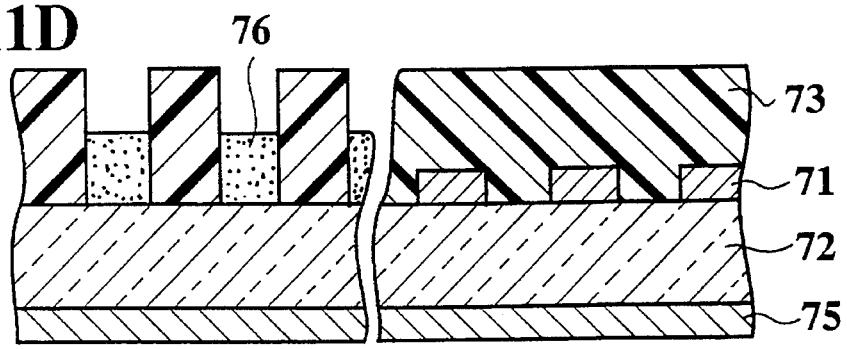

Therefore, as shown in FIG. 11D, silicon dioxide films 76 are deposited in self-alignment on the substrate 72 between the resist layers 74. At this time, the silicon dioxide is not deposited on the resist layers 73, 74 because the layers 73, 74 are made of an organic substance.

The silicon dioxide film 76 is exactly $\lambda/2(n-1)$ μm thick in the same manner as in the first method. Therefore, the silicon dioxide films 76 function as the phase shifters shown in FIG. 5.

Figure 11E:
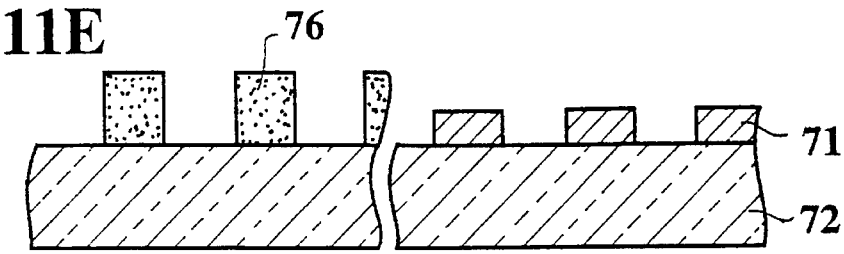

Thereafter, the resist layers 73, 74 and the protective layers 75 are removed by immersing the substrate 72 with the deposited silicon dioxide films 76 in a removal solution such as sulfuric acid. Therefore, as shown in FIG. 11E, an exposure mask integrally formed by both a shift edge type of phase-shifting mask and no phase-shifting mask is obtained.

In the shift edge type of exposure mask manufactured by the method according to the fifth embodiment, the resist layers 73, 74 and the protective layers 75 can be removed by the sulfuric acid without being disturbed by the silicon dioxide because the silicon dioxide is not deposited on the resist layers 73, 74 and the protective layers 75.

Moreover, because both a shift edge type of phase-shifting mask and no phase-shifting mask is integrally manufactured, the exposure mask is appropriate in cases where cell sections and peripheral circuits must be simultaneously patterned on a semiconductor device by irradiating bright and dark lights transmitted through the exposure mask. Usually, the cell sections must be minutely patterned so that it is difficult to pattern the cell sections by utilizing an exposure mask with a phase-shifting mask. On the other hand, the peripheral circuits need not be minutely patterned so that an exposure mask with a phase-shifting mask is appropriate to pattern the peripheral circuits.

Therefore, the exposure mask manufactured by the method according to the fifth embodiment is appropriate for simultaneously patterning the cell circuits and the peripheral circuits. That is, the bright and dark lights transmitted through the second part of the substrate 72 are irradiated on the semiconductor device to pattern the peripheral circuits, while the bright and dark lights transmitted through the first part of substrate 72 are irradiated to the semiconductor device to pattern the cell circuits.

Though the SORD method is utilized in the fifth embodiment, it is preferable that the modified SORD method be utilized in the same manner as in the second embodiment in place of the SORD method.

Moreover, it is preferable that the further modified SORD method be utilized.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A method of manufacturing an exposure mask comprising the steps of:

(a) forming a patterned shading film, having openings, on a first of two opposite surfaces of a transparent substrate, said transparent substrate having a chemical composition which is different from the chemical composition of said shading film;

(b) coating a photoresist film over said patterned shading film formed on part of the first surface of said transparent substrate, the photoresist film comprising a material which is resistant to selective deposition of silicon dioxide;

(c) exposing said photoresist film to light which is projected toward said photoresist film from a point opposite the other surface of the two opposite surfaces of the transparent substrate through said transparent substrate and the openings of said patterned shading film to partially develop said photoresist film;

(d) after step (c), removing the undeveloped portion of said photoresist film located over said patterned shading film in order to form pattern openings through the photoresist film;

(e) after step (d), immersing said transparent substrate in a solution in which silicon dioxide is dissolved;

(f) then, initiating selective deposition of silicon dioxide on said pattern shading film and on the first surface of said transparent substrate within the pattern openings of the photoresist film to thereby form a phase shifter; and (g) after step (f) removing the remaining developed portion of said photoresist film wherein said exposure of said photoresist film is terminated at a point and time such that the developed portion of said photoresist film remains separated from said shading film to form an exposed surface of said transparent substrate between said shading film and said photoresist film prior to the immersing step.

* * * * *